United States Patent
Chang et al.

(10) Patent No.: US 8,277,619 B2
(45) Date of Patent: Oct. 2, 2012

(54) APPARATUS FOR ELECTROCHEMICAL PLATING SEMICONDUCTOR WAFERS

(75) Inventors: Chung-Liang Chang, Hsin-Chu (TW); Shau-Lin Shue, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/176,839

(22) Filed: Jul. 6, 2011

(65) Prior Publication Data
US 2011/0259734 A1  Oct. 27, 2011

Related U.S. Application Data

(62) Division of application No. 12/705,903, filed on Feb. 15, 2010, now Pat. No. 7,988,843, and a division of application No. 11/043,601, filed on Jan. 25, 2005, now Pat. No. 7,704,368.

(51) Int. Cl.
*C25B 9/04* (2006.01)
*C25B 9/02* (2006.01)
*C25D 17/04* (2006.01)
*C25D 17/06* (2006.01)

(52) U.S. Cl. ........... 204/228.9; 204/229.1; 204/230.2; 204/230.7; 204/224 R; 204/278.5; 204/297.01; 204/286.1; 204/287

(58) Field of Classification Search ............ 204/224 R, 204/228.9, 229.1, 230.2, 230.7, 278.5, 297.01, 204/286.1, 287
See application file for complete search history.

(56) References Cited

U.S. PATENT DOCUMENTS

| | | |
|---|---|---|
| 6,495,007 B2 | 12/2002 | Wang |
| 6,518,668 B2 | 2/2003 | Cohen |
| 6,793,796 B2 | 9/2004 | Reid et al. |
| 7,854,828 B2 * | 12/2010 | Reid et al. ............ 205/96 |
| 2002/0046952 A1 * | 4/2002 | Graham et al. ......... 205/99 |
| 2004/0149584 A1 | 8/2004 | Nagai et al. |
| 2004/0217009 A1 | 11/2004 | Mikkola et al. |
| 2005/0155866 A1 | 7/2005 | Gabe et al. |
| 2010/0032303 A1 * | 2/2010 | Reid et al. ............ 205/96 |
| 2011/0284386 A1 * | 11/2011 | Willey et al. .......... 205/96 |

OTHER PUBLICATIONS

Office Action mailed Jul. 17, 2009, for corresponding U.S. Appl. No. 11/043,601, filed Jan. 25, 2005, 9 pages.
Office Action mailed Nov. 29, 2010, for corresponding U.S. Appl. No. 12/705,903, filed Feb. 15, 2010, 11 pages.

* cited by examiner

*Primary Examiner* — Bruce Bell
(74) *Attorney, Agent, or Firm* — Haynes and Boone, LLP

(57) ABSTRACT

An electroplating apparatus for depositing a conductive material on a semiconductor wafer includes a vessel for holding an electroplating bath, a support for holding a semiconductor wafer within the vessel and beneath a surface of the bath; first and second electrodes within the vessel, between which an electrical current may flow causing conductive material to be electrolytically deposited onto the wafer, a third electrode disposed outside of the bath for applying a static electric charge to the wafer, and an electrical power supply coupled with the third electrode.

20 Claims, 2 Drawing Sheets

APPARATUS FOR ELECTROCHEMICAL PLATING SEMICONDUCTOR WAFERS

PRIORITY

The present application is a divisional of U.S. Ser. No. 12/705,903 filed Feb. 15, 2010, which is a divisional of U.S. Ser. No. 11/043,601 filed Jan. 25, 2005, the entire disclosures of which are hereby incorporated by reference.

FIELD

This disclosure generally relates to electro-deposition of materials on semiconductor wafers, and more particularly to a method and apparatus for controlling the initial stage of the electroplating process in order to improve gap fill and reduce intrinsic defects.

BACKGROUND OF THE INVENTION

In order to increase signal speed performance in integrated circuits, copper and silver are being used with increasing frequency for interconnects because of their lower resistance compared to, for example, aluminum. In addition to possessing lower resistance compared to aluminum, copper possesses superior migration and exhibits higher reliability. The techniques used to achieve copper metallization include CVD, selective electroless deposition, sputtering (PVD) and electroplating. Electrochemical deposition of copper is a leading technology because of its low cost, fast deposition rate and superior copper properties. However, copper interconnect electrodeposition faces challenges in the form of non-uniformity of the copper layer over the wafer and filling of small, high aspect ratio contact holes without void formation.

The electrochemical deposition of copper is caused by the passage of electrical current between two electrodes through a copper sulfate solution or other copper containing electrolytes. The electrical current to the electrode is electronic, while the current in the electrolyte is ionic. At the cathode, electrochemical reduction occurs, while electrochemical oxidation occurs at the anode which is normally formed of copper. In this arrangement, copper ions removed at the cathode are replaced by copper ions produced at the anode. Copper ions are transported to the cathode by electrical drift, diffusion and convection. The required voltage necessary to pass a certain current is the sum of ohmic drop in the electrolyte, the surface over potential across the double layer and the concentration over potential associated with the diffusion layer. Electroplating can be carried out at constant current, constant voltage or variable forms of current or voltage. The distribution of current, and hence the distribution of the thickness of the copper layer across the cathode depends on its geometry, the kinetics of the electrochemical reaction and concentration variations, as determined by the hydrodynamics and the convective mass transport in the electrolyte.

In the case of copper electroplating on silicon wafer, the $SiO_2$-covered wafer is coated with a thin conductive layer of copper, normally referred to as the seed layer, in order to assure electronic conductivity. The wafer is exposed to an electrolyte containing copper ions and electrical contact is established between the seed layer and the power supply by several contact points along the periphery of the wafer. Constant current is passed for a certain length of time, resulting in a corresponding thickness of copper layer.

Because copper reacts with $SiO_2$, it is necessary to confine it using a barrier layer of material, such as tantalum nitride which is pre-deposited on the $SiO_2$ by sputtering. The copper seed layer is needed next for good electrical contact and inhesion. Copper electroplating is usually obtained from an aqueous solution of $CuSO_4$ and $H_2SO_4$, in the presence of several additives and leveling agents. Additives such as accelerators and suppressors are used to control deposition rate and assure void-free filling of sub-25 micron high aspect ratio structures. Suppressors absorb water on the surface and slow down copper deposition in the absorbed areas. The accelerator competes with suppressor molecules for adsorption sites and accelerates copper deposition in the absorbed areas. During electroplating, both the suppressor and the accelerator are consumed at the wafer surface but are being constantly replenished by diffusion from the bulk electrolyte.

Grain size, the presence of impurities, pitting and voids in the electroplated copper layer are only a few of the defects that can result from an improper balance in the electrochemistry during the plating process. In particular, the balance of the additives can be significantly affective by the voltage, current and plating times that are chosen during the plating process.

Accordingly, there is a clear need in the art for an improved process control that maintains plating bath additives in proper balance so that the desired defect-free plating build-up occurs, particularly in trenches and vias. The present invention is intended to satisfy this need.

SUMMARY

According to embodiment, a method of electroplating at conductive material such as copper on a semiconductor wafer comprises immersing the wafer in a plating bath, applying a voltage to the wafer, passing an electrical current through the bath and the wafer, and limiting the current flow to a density of not greater than 0.1 amps per square centimeter as the wafer is being immersed. The step of limiting the current density is performed during the time period that the wafer is being initially immersed into the plating bath. A static electric charge preferably applied to the wafer before and during immersion in order to enhance competitive adsorption of an accelerator additive used in the bath to control the plating rate.

According to another embodiment, electroplating apparatus for depositing a conductive material on a semi-conductor wafer is provided, comprising a vessel for holding an electroplating bath, a support for holding a semi-conductive wafer within the vessel, a pair of electrodes within the vessel between which an electrical current may flow causing conductive material to be electrolytically deposited onto the wafer. The apparatus also includes a third electrode disposed outside of the bath for applying a static charge to the wafer, as well as a electrical power source supplying power to the third electrode. The third electrode is located outside the vessel but in proximity to the bath and is preferably charged to a voltage of between 1 and 100 volts.

Some embodiments provide an improved electroplating process for depositing conductive layers on a semi-conductor wafer that provides superior bottom up filling of trenches and vias, with fewer defects.

Some embodiments provide an electroplating process as described above which provides accelerator adsorption or activation with less surface potential sensitivity.

Some embodiments provide a process as described above which controls the initial deposit of the conductive material onto the wafer surface as the wafer is initially being immersed into the plating bath.

Some embodiments provide improved electroplating apparatus that permits better control of process parameters during the stage of the plating process when the wafer is being initially immersed into the plating bath.

BRIEF DESCRIPTION OF THE DRAWINGS

In the drawings, which form an integral part of the specification and are to be read in conjunction therewith, and in which like reference numerals are employed to designate identical components in the various views.

DETAILED DESCRIPTION OF THE EMBODIMENTS

The process for electroplating copper on a semi-conductor wafer begins with depositing a barrier layer of a material such as tantalum nitride by means such as sputtering. Next, a seed layer of copper is applied over the barrier layer using atomic layer deposition techniques. The seed layer of copper is applied to assure good electrical contact and adhesion of subsequent layers of copper. The seed layer of copper may be between 100 and 1000 angstroms. Copper electroplating is then performed in a conventional electroplating apparatus which includes a vessel containing an aqueous solution of CuSO4 and H2SO4, in the presence of several additives and leveling agents. The wafer is held by flexibly mounted gripping fingers (not shown) on the bottom of a spinning clam shell support which rotates the wafer while submerged in the plating bath. The wafer is electrically connected to a power source and acts as a cathode. A copper anode disposed within the plating bath is also connected to the electrical power source. Suitable pumps are uses to create a flow of the plating bath over the face of the wafer as the latter is rotated up to speeds up to 2000 rpms. The plating process proceeds through four distinct stages, and in this connection reference is now made to FIG. 2. In a first stage referred to herein as the "approach" designated by the letter A in FIG. 2, the wafer is lowered into the plating bath, and as can be appreciated from FIG. 2, there is no current flow through the wafer. The next stage represented by the letter B, consists of moving the wafer down into the plating bath, i.e., immersing the wafer in the bath, at which time electrical current flow commences. The next stage designated by the letter C is referred to as the swing stage in which current flow is limited to a specified value for a pre-determined length of time, following which the fourth and final stage designated by the letter D is carried out, which consists of continuing the current flow at a higher level. In illustrated example, stage A requires 4.25 seconds to move the wafer into initial contact with the plating bath, at which time current flow commences and steadily builds until the end of stage B at 5.75 seconds of elapsed time. The applied current is held relatively constant until the end of Stage C at 8.25 seconds at which time it is increased and held constant throughout the final Stage D.

Figure 3:
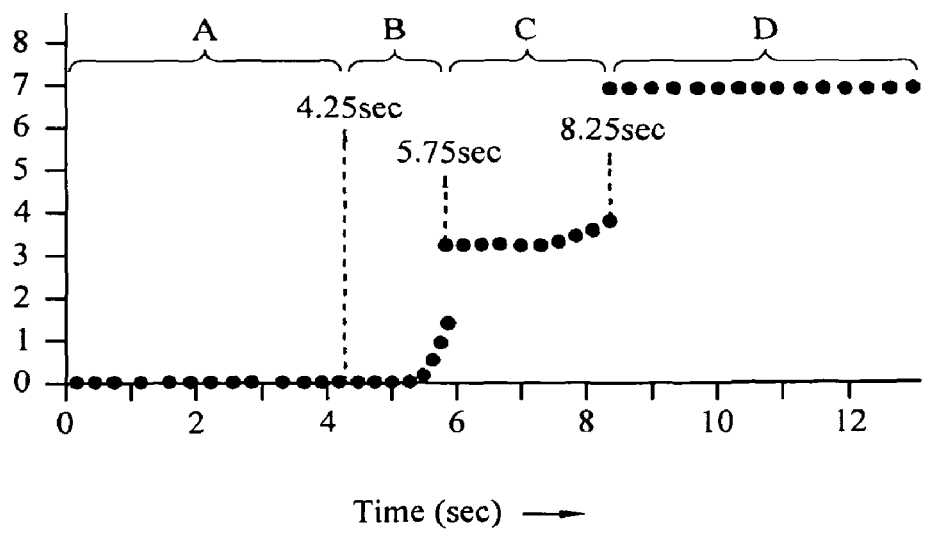

In accordance with the present invention, it has been found that the current flow occurring during the immersion or stage B has a significant affect on gap fill and the incubation time of bottom up fill initiation. This is the result of the current flow adversely affecting accelerator absorption or activation, or poisoning by suppressor additives in the plating bath. According to the present invention, the problems mentioned immediately above as well as the defects resulting therefrom can be substantially reduced by limiting the current density to no greater than about 0.1 amps per square centimeter, and preferably 0 amps per square centimeter. The step of limiting the current density during the immersion stage is graphically shown in FIG. 3, where the current is maintained near 0 until the end of the immersion Stage B.

Figure 2:
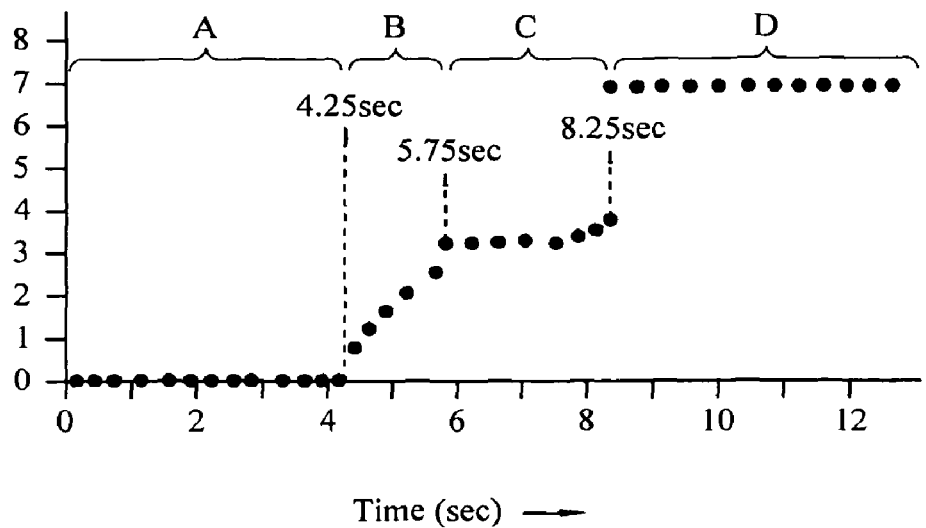
FIG. 2 is a graph showing plating current over time for a prior art electroplating process; and, FIG. 3 is a graph similar to FIG. 2 but showing current flow over time for the process forming embodiments of the present invention.

A series of experiments were performed using a variety of commercially available plating solutions and a variety of voltages and currents applied during the plating process. The 0 or near 0 current densities during the immersion stage are achieved by reducing the applied voltage to the circuit containing the wafer of the bath. For example, in one set of experiments, the voltage applied during the immersion stage was 0.2 volts, compared to 3.5 volts applied during this stage using the conventional plating techniques (FIG. 2). The inventive technique, which will be referred to herein as "low bias entry" was found to be particularly effective in reducing defects when higher annealing temperatures were used following the plating process. For example, using the inventive low bias entry technique described above, wafers exhibited significantly lower defects when annealed at temperatures at 260 degrees centigrade, compared to lower temperatures, e.g. 180 degrees centigrade. The lower bias entry technique reduces the deposition rate during the immersion stage B, and effectively provides buffer time during which pre-layer particles are removed so that a uniform surface coverage of additives can be formed. The lower bias entry technique was also found to increase SM reliability, regardless of the mix of chemicals used in the electroplating bath.

Figure 1:
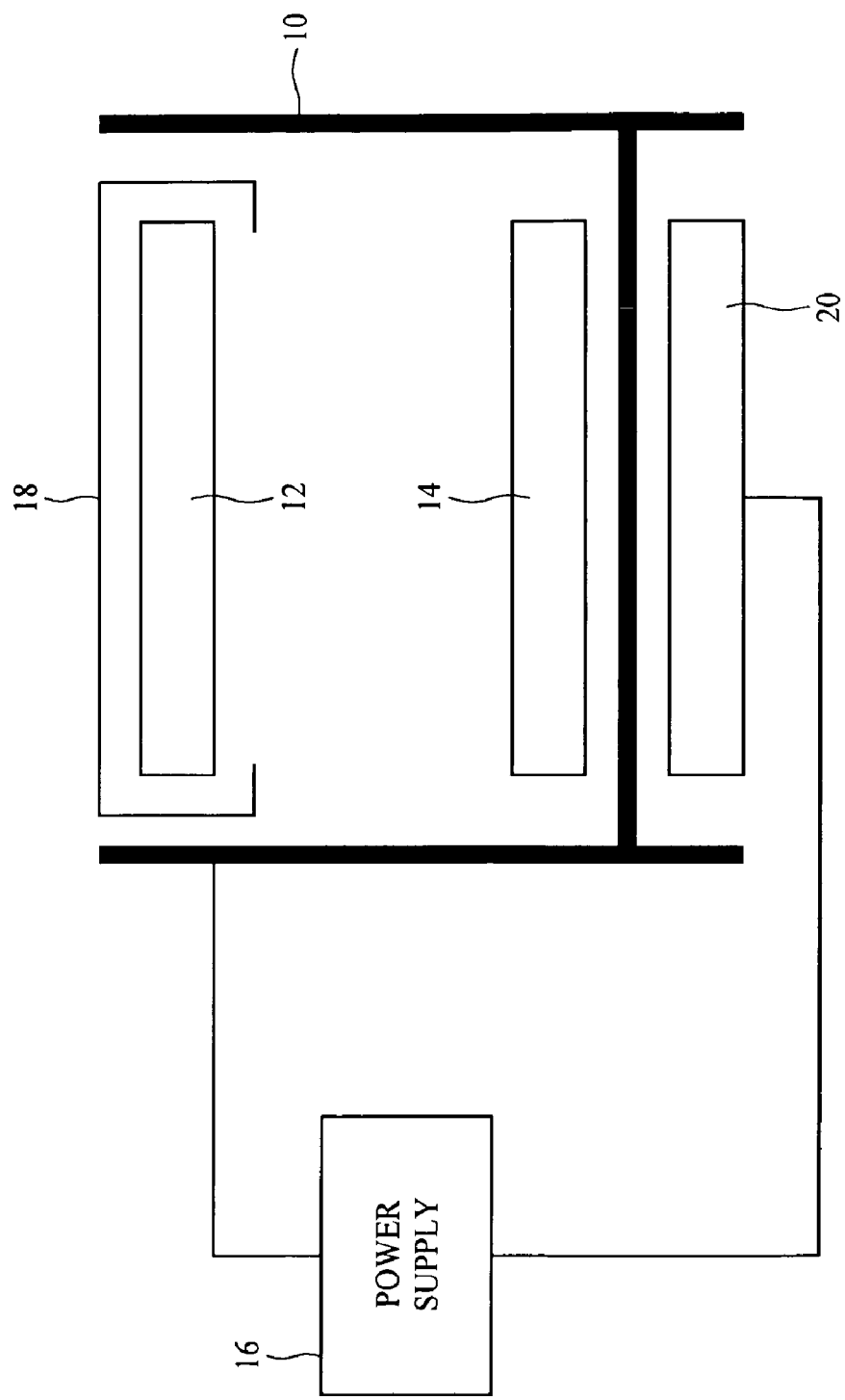
FIG. 1 is a combined block and diagrammatic view of electroplating apparatus forming embodiments of the invention.

Referring also to now FIG. 1, it has been furthered discovered that superior control over the plated copper microstructure can be achieved by applying a static charge on the wafer prior to commencing the immersion stage B. This static charge may be applied to the wafer using the arrangement shown in FIG. 1. A vessel or tank 10 holds quantity of a suitable plating bath, such as the types previously mentioned. A clam-shell shaped fixture 18 is adapted to hold and rotate the wafer 12. The wafer 12 acts as a cathode onto which material is deposited derived from a copper anode 14 disposed within the vessel 10 within the plating bath. A third electrode 20 is disposed beneath the vessel 10 but in proximity to the plating bath. A power supply 16 is coupled in an open circuit with electrode 20 and a fixture 18 so as to apply a static electric charge to the wafer 12. Depending upon the size and geometry of the components of an actual embodiment, it has been found that applying a bias voltage to the wafer 12 of between approximately 1 and 100 volts provides superior results. The static charge applied to the wafer 12 in this manner was found to enhance accelerator competitive adsorption on the surface of the wafer 12. It is believed that accelerator competitive adsorption is improved as a result of a static charge activating the accelerator.

Optimum results in terms of reduced defects was achieved using a combination of low bias entry and a static charge on the wafer during the immersion process, followed by higher annealing temperatures of approximately 260 degrees senegrate, for example. It should be noted here that the method and apparatus described above can also be used to electroplate silver with similar results.

It is to be understood that the specific methods and apparatus which have been described are merely are illustrative of one application of the principal of the invention. Numerous modifications may be made to the method and apparatus as described above without departing from the true spirit and scope of the invention.

What is claimed is:

1. An electroplating apparatus for depositing a conductive material on a semiconductor wafer, comprising:
   a vessel for holding an electroplating bath;
   a support for holding a semiconductor wafer within the vessel and beneath a surface of the bath;
   first and second electrodes within the vessel, between which an electrical current may flow causing conductive material to be electrolytically deposited onto the wafer;
   a third electrode disposed outside of the bath for applying a static electric charge to the wafer; and
   an electrical power supply coupled with the third electrode.

2. The apparatus of claim 1, wherein the third electrode is disposed beneath the vessel in proximity to the bath.

3. The apparatus of claim 1, wherein the static charge applied to the wafer is between 1 and 100 volts.

4. The apparatus of claim 1, wherein the third electrode and the power supply are connected with each other in an open circuit.

5. The apparatus of claim 4 in which the power supply is further connected to the wafer in the open circuit.

6. The apparatus of claim 1 in which the bath includes an aqueous solution of $CuSO_4$ and $H_2SO_4$.

7. The apparatus of claim 6 in which the bath further includes an accelerator and a suppressor.

8. The apparatus of claim 1 in which the support rotates the wafer in the bath.

9. The apparatus of claim 1 further comprising a pump in communication with the bath to create a flow of bath over the wafer.

10. An system for electroplating a semiconductor wafer, the apparatus comprising:
    a tank with a bath of aqueous solution;
    a support holding the wafer in the bath;
    an anode disposed within the bath;
    an electrode outside of the tank in proximity to the bath; and
    a power supply in electrical communication with the wafer in the bath and with the electrode outside of the tank, the power supply applying a static charge to the wafer.

11. The system of claim 10 in which the electrode outside of the tank is disposed beneath the tank.

12. The system of claim 10 in which the aqueous comprises $CuSO_4$ and $H_2SO_4$.

13. The system of claim 12 in which the bath further comprises an accelerator and a suppressor.

14. The system of claim 10 in which the support rotates the wafer in the bath.

15. The system of claim 10 further comprising a pump in communication with the bath to create a flow of bath over the wafer.

16. A system for depositing a conductive material on a substrate, comprising:
    means for immersing the substrate in a solution including the conductive material and a plating accelerator;
    means for passing an electrical current through the solution and the wafer after immersing; and
    means for applying a static electric charge to the substrate prior to immersing in the solution, in which the means for applying a static charge include a power supply in electrical communication in an open circuit with the substrate and an electrode placed outside of the solution.

17. The system of claim 16 in which the means for passing an electrical current comprise an electrode in the solution.

18. The system of claim 16 in which the means for immersing comprise a tank containing the solution and a support for holding and rotating the substrate within the solution.

19. The system of claim 16 in which the solution includes $CuSO_4$ and $H_2SO_4$.

20. The system of claim 16 further comprising means for creating a flow of solution over the wafer.

* * * * *